US012727432B2

(12) United States Patent
Chang et al.

(10) Patent No.: US 12,727,432 B2
(45) Date of Patent: Sep. 1, 2026

(54) SEMICONDUCTOR DEVICE, METHOD AND TOOL OF MANUFACTURE

(71) Applicant: Taiwan Semiconductor Manufacturing Co., Ltd., Hsinchu (TW)

(72) Inventors: Shih-Yu Chang, Yunlin County (TW); Chien-Han Chen, Nantou County (TW); Chien-Chih Chiu, Xinying City (TW); Chi-Che Tseng, Taoyuan City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 686 days.

(21) Appl. No.: 17/520,301

(22) Filed: Nov. 5, 2021

(65) Prior Publication Data

US 2022/0367226 A1 Nov. 17, 2022

Related U.S. Application Data

(60) Provisional application No. 63/188,216, filed on May 13, 2021.

(51) Int. Cl.

| | |
|---|---|
| ***H10P 72/72*** | (2026.01) |
| ***H10D 84/01*** | (2026.01) |
| ***H10D 84/03*** | (2025.01) |
| ***H10P 50/24*** | (2026.01) |
| ***H10P 72/00*** | (2026.01) |
| ***H10P 72/76*** | (2026.01) |

(52) U.S. Cl.
CPC ........ *H10P 72/722* (2026.01); *H10P 72/0418* (2026.01); *H10P 72/7614* (2026.01); *H10D 84/0193* (2025.01); *H10D 84/038* (2025.01); *H10P 50/242* (2026.01)

(58) Field of Classification Search
CPC ........... H01J 37/32568; H01J 37/32642; H01J 37/32715; H01L 21/3065; H01L 21/31116; H01L 21/32136; H01L 21/67063; H01L 21/67069; H01L 21/6833; H01L 21/6875
USPC ........................................................ 29/825, 740
See application file for complete search history.

(56) References Cited

U.S. PATENT DOCUMENTS

| | | | | |
|---|---|---|---|---|
| 8,894,806 | B2 | 11/2014 | Koshimizu et al. | |
| 10,002,744 | B2 * | 6/2018 | Chen ................ | H01J 37/32174 |
| 10,163,642 | B2 | 12/2018 | Liao et al. | |

(Continued)

FOREIGN PATENT DOCUMENTS

| | | |
|---|---|---|
| CN | 101847558 A | 9/2010 |
| CN | 103811247 A | 5/2014 |

(Continued)

*Primary Examiner* — Minh N Trinh
(74) *Attorney, Agent, or Firm* — Slater Matsil, LLP

(57) ABSTRACT

Semiconductor devices, methods of manufacturing the semiconductor device and tools are disclosed herein. Some methods include providing an electrostatic chuck and placing an edge ring adjacent to the electrostatic chuck. The electrostatic chuck includes a first electrode to generate a sheath at a first distance over the electrostatic chuck. The edge ring includes a coil and a second electrode to generate an electric field control to maintain a portion of the sheath over the edge ring in a coplanar orientation with the portion of the sheath over the electrostatic chuck.

20 Claims, 12 Drawing Sheets

(56) References Cited

U.S. PATENT DOCUMENTS

| | | | | |
|---|---|---|---|---|
| 10,964,578 | B2 * | 3/2021 | Sung | H01L 21/67213 |
| 12,027,345 | B2 | 7/2024 | Liu et al. | |
| 2005/0211546 | A1 * | 9/2005 | Hanawa | H01J 37/32449<br>204/192.12 |
| 2008/0020574 | A1 * | 1/2008 | Marakhtanov | H01J 37/321<br>156/345.46 |
| 2010/0243606 | A1 * | 9/2010 | Koshimizu | H01J 37/32091<br>156/345.44 |
| 2010/0304572 | A1 * | 12/2010 | Koshimizu | H01J 37/32623<br>156/345.28 |
| 2015/0047563 | A1 * | 2/2015 | Chung | H01J 37/32477<br>118/715 |
| 2017/0047202 | A1 | 2/2017 | Kumar | |
| 2018/0144970 | A1 * | 5/2018 | Chuang | H01L 29/66795 |
| 2018/0350566 | A1 | 12/2018 | Tobe et al. | |
| 2019/0006156 | A1 | 1/2019 | Seo et al. | |
| 2021/0125813 | A1 | 4/2021 | Jeong | |
| 2022/0367226 | A1 * | 11/2022 | Chang | H01L 21/67069 |

FOREIGN PATENT DOCUMENTS

| | | | |
|---|---|---|---|
| CN | 107564811 | A | 1/2018 |
| CN | 108475633 | A | 8/2018 |
| CN | 109256316 | A | 1/2019 |
| CN | 111128666 | A | 5/2020 |
| CN | 111199860 | A | 5/2020 |
| CN | 111383887 | A | 7/2020 |
| JP | 2007258417 | A | 10/2007 |

* cited by examiner

SEMICONDUCTOR DEVICE, METHOD AND TOOL OF MANUFACTURE

PRIORITY CLAIM AND CROSS-REFERENCE

This application claims the benefit of U.S. Provisional Application No. 63/188,216, filed on May 13, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Furthermore, as more components are integrated into a given area, sophisticated three-dimensional (3D) integrated circuit (3DIC) packaging techniques may be employed to further improve integration density such that even complex systems may be integrated into 3DIC devices. However, as the minimum features sizes are reduced and as more complex systems are integrated into 3DIC devices, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
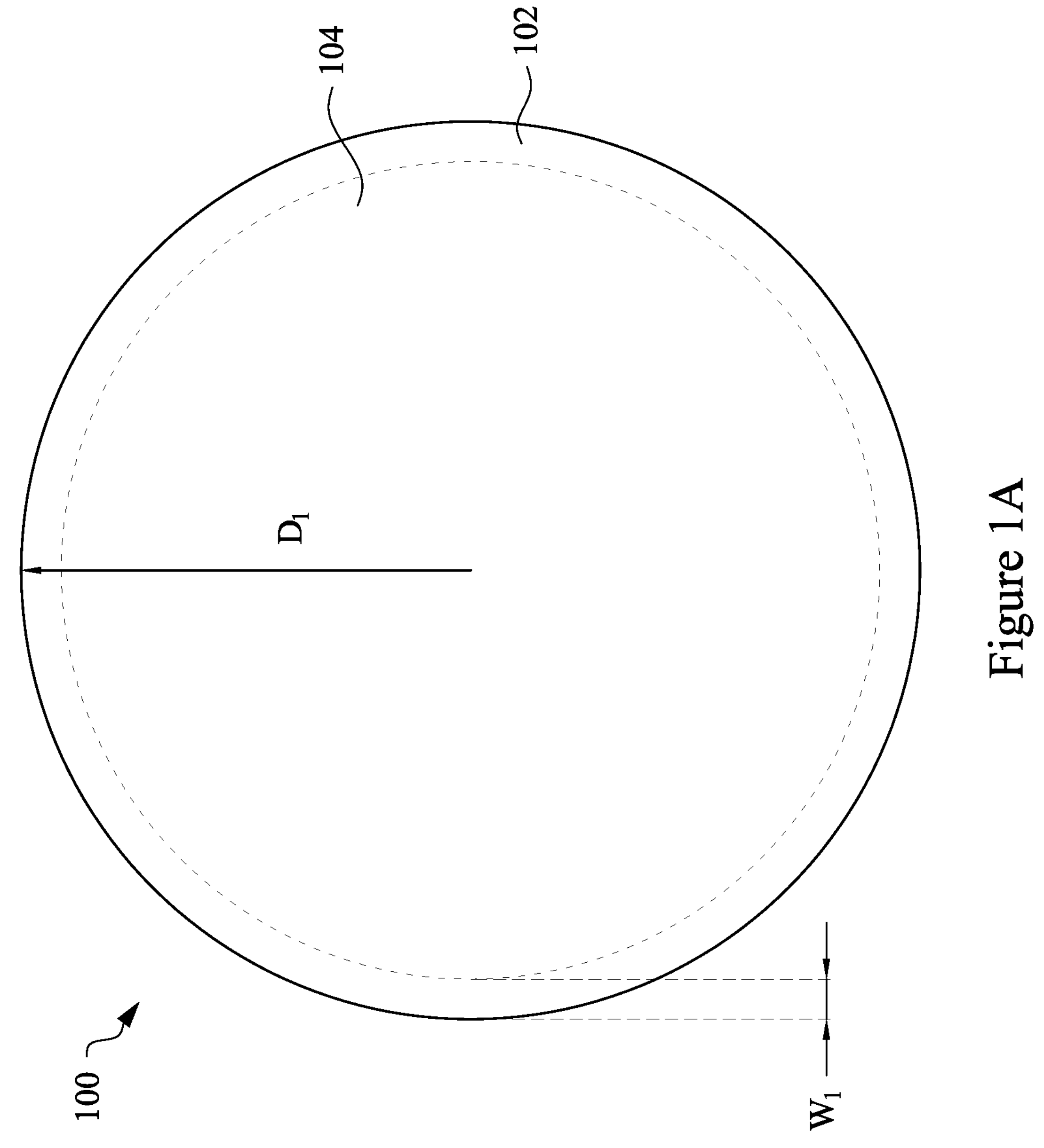
FIGS. 1A-1B illustrates a semiconductor wafer with fins and a gate electrode material in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1A, there is illustrated a top-down view of a semiconductor wafer 100 that has been covered with a gate electrode material 111. In an embodiment the semiconductor wafer 100 may be viewed as having a central region 104 and an edge region 102. These regions are indicated as being separate from each other in FIG. 1A by the dashed circle, although no such circle is readily apparent in the actual product.

In an embodiment the edge region 102 of the semiconductor wafer 100 may be a region that is potentially affected by a curvature of an electrical field and plasma sheath during, e.g., an etching process (described further below with respect to FIGS. 3A-3C). For example, in an embodiment in which the semiconductor wafer 100 as a whole has a diameter that is a first distance $D_1$ of between about 149 mm to about 300 mm, the edge region 102 may have a first width $W_1$ of between about 20 mm and about 25 mm, such as about 24 mm.

Figure 1B:
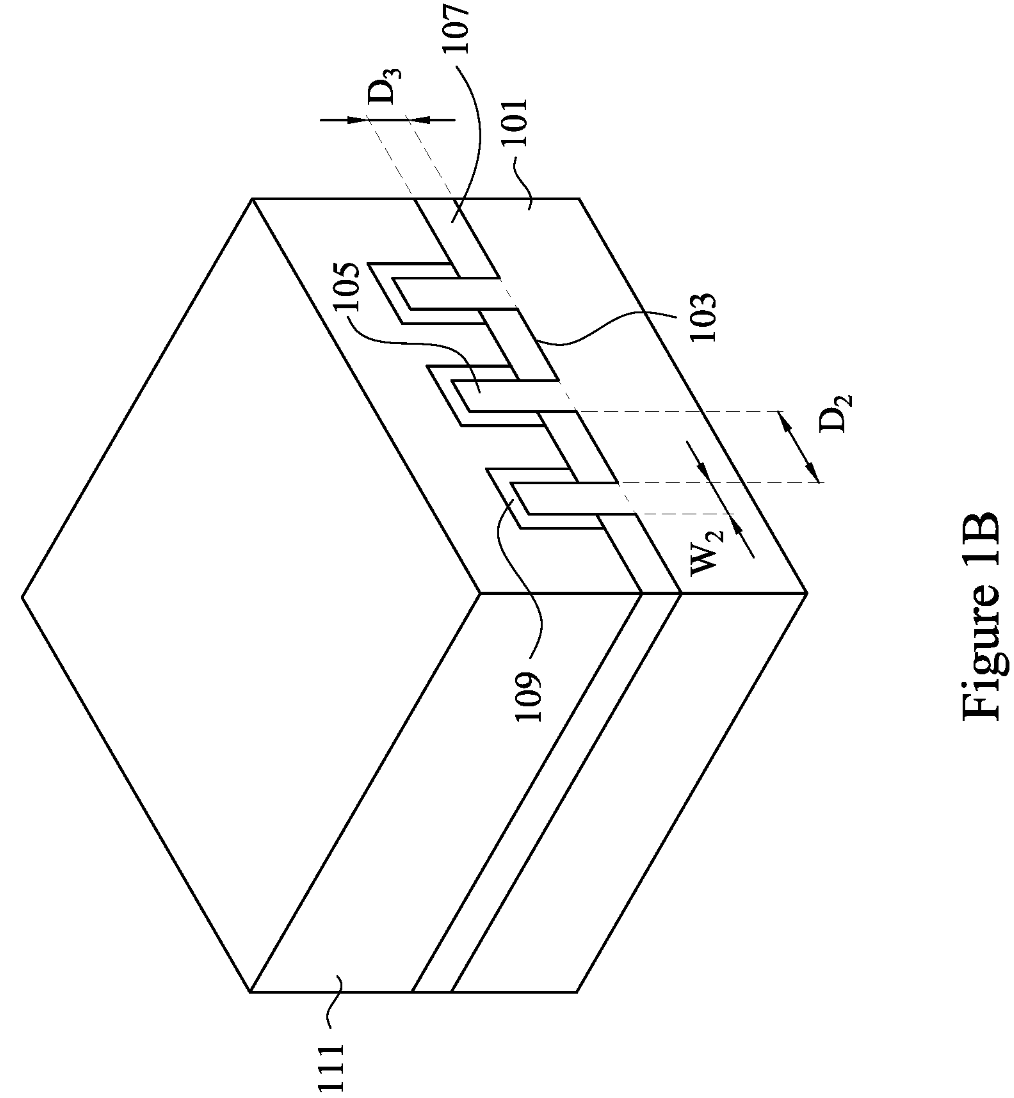

FIG. 1B illustrates a close up view of structures on and in the semiconductor wafer 100, and the structures formed as illustrated in FIG. 1B are located within the edge region 102 of the semiconductor wafer 100 illustrated in FIG. 1A. As illustrated in FIG. 1B, there is shown a substrate 101 with first trenches 103 formed therein. The substrate 101 may be a silicon substrate, although other substrates, such as semiconductor-on-insulator (SOI), strained SOL and silicon germanium on insulator, could be used. The substrate 101 may be a p-type semiconductor, although in other embodiments, it could be an n-type semiconductor.

The first trenches 103 may be formed as an initial step in the eventual formation of first isolation regions 107. The first trenches 103 may be formed using a masking layer (not separately illustrated in FIG. 1B) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 are formed may be utilized. Any suitable process, including any number of masking and removal steps may be used.

In addition to forming the first trenches 103, the masking and etching process additionally forms the fins 105 from those portions of the substrate 101 that remain unremoved. For convenience the fins 105 have been illustrated in the figures as being separated from the substrate 101 by a dashed line, although a physical indication may or may not be present. These fins 105 may be used, as discussed below, to form the channel region of multiple-gate FinFET transistors. While FIG. 1A only illustrates three of the fins 105 formed from the substrate 101, any number of fins 105 may be utilized. Furthermore, although the first isolation regions 107 are described and/or illustrated as being separate from the substrate 101, as used herein the term "substrate" may be used to refer to just the semiconductor substrate or a semiconductor substrate inclusive of the first isolation regions 107. Additionally, although the fins 105 are illustrated as a single continuous material as the substrate 101, the fins 105 and/or the substrate 101 may comprise a single material or a plurality of materials. In this context, the fins 105 refer to the portions extending between the neighboring first isolation regions 107.

The fins 105 may be formed such that they have a second width $W_2$ at the surface of the substrate 101 of between about 5 nm and about 80 nm. Additionally, the fins 105 may be spaced apart from each other by a second distance $D_2$ of between about 21 nm and about 26 nm. By spacing the fins 105 in such a fashion, the fins 105 may each form a separate channel region while still being close enough to share a common gate (discussed further below).

The fins 105 may be patterned by any suitable method. For example, the fins 105 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 105.

Once the first trenches 103 and the fins 105 have been formed, the first trenches 103 may be filled with a dielectric material and the dielectric material may be recessed within the first trenches 103 to form the first isolation regions 107. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The dielectric material may be used to form the first isolation regions 107 by initially overfilling the first trenches 103 and the substrate 101 with the dielectric material and then removing the excess material outside of the first trenches 103 and the fins 105 through a suitable process such as chemical mechanical polishing (CMP), an etch, a combination of these, or the like. In an embodiment, the removal process removes any dielectric material that is located over the fins 105 as well, so that the removal of the dielectric material will expose the surface of the fins 105 to further processing steps.

Once the first trenches 103 have been filled with the dielectric material, the dielectric material may then be recessed away from the surface of the fins 105. The recessing may be performed to expose at least a portion of the sidewalls of the fins 105 adjacent to the top surface of the fins 105. The dielectric material may be recessed using a wet etch by dipping the top surface of the fins 105 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a third distance $D_3$ from the base of the fins 105 of between about 40 Å and about 500 Å. Additionally, the recessing may also remove any leftover dielectric material located over the fins 105 to ensure that the fins 105 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 107 have been formed, a gate dielectric material 109 and a gate electrode material 111 may be formed over each of the fins 105. In an embodiment the gate dielectric material 109 may be formed by thermal oxidation, chemical vapor deposition, sputtering, or any other suitable method. Depending on the technique of gate dielectric formation, the gate dielectric material 109 thickness on the top of the fins 105 may be different from the gate dielectric thickness on the sidewall of the fins 105.

The gate dielectric material 109 may comprise a material such as silicon dioxide or silicon oxynitride. The gate dielectric material 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof. Additionally, any combination of silicon dioxide, silicon oxynitride, and/or high-k materials may also be used for the gate dielectric material 109.

The gate electrode material 111 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode material 111 may be deposited by chemical vapor deposition (CVD), sputter deposition, or other suitable techniques for depositing conductive materials. The thickness of the gate electrode material 111 may be in the range of about 150 nm to about 180 nm, such as about 160 nm. The top surface of the gate electrode material 111 may have a non-planar top surface, and may be planarized prior to patterning of the gate electrode material 111 or gate etch. Ions may or may not be introduced into the gate electrode material 111 at this point. Ions may be introduced, for example, by ion implantation techniques.

Figure 2A:
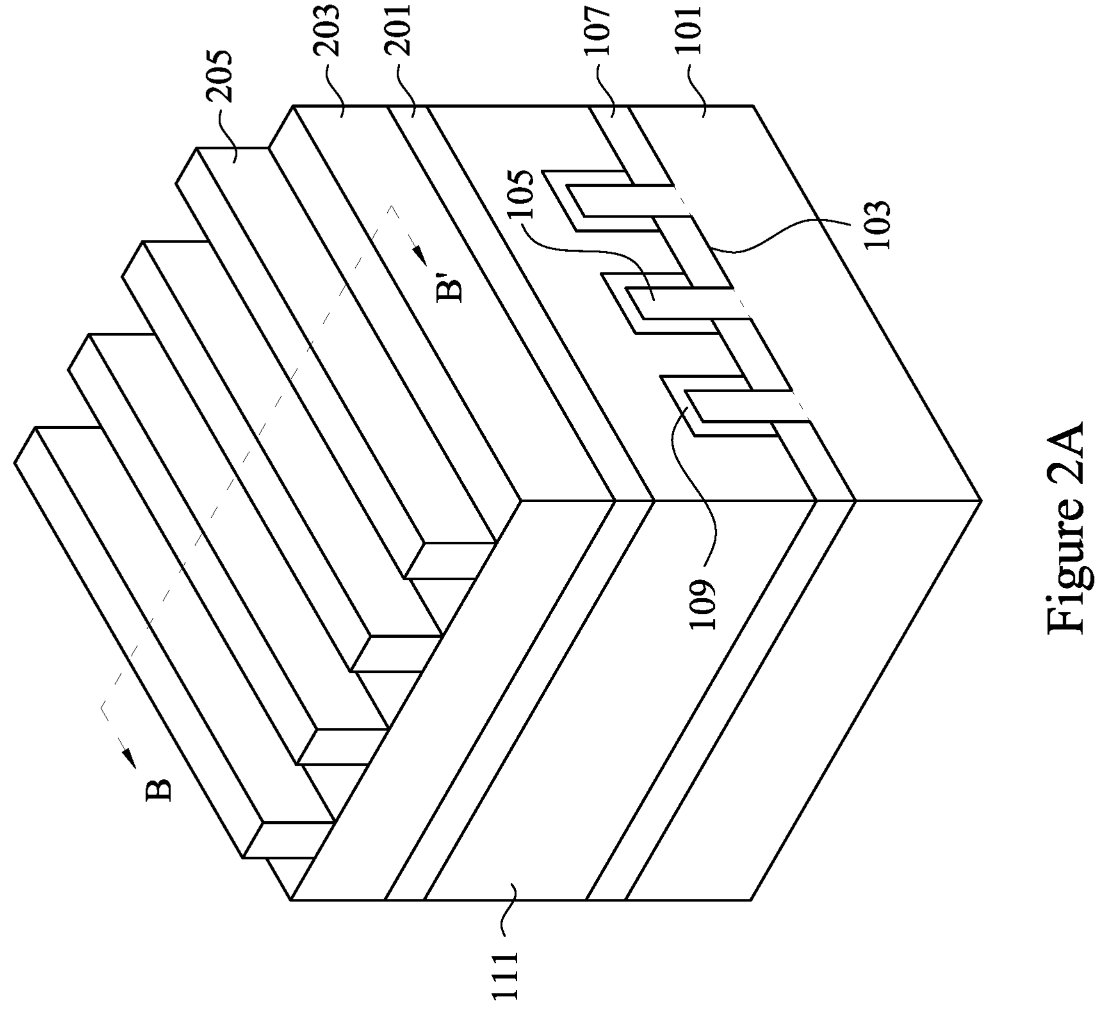
FIGS. 2A-2B illustrate a formation of hardmasks and a photoresist in accordance with some embodiments.
Figure 2B:
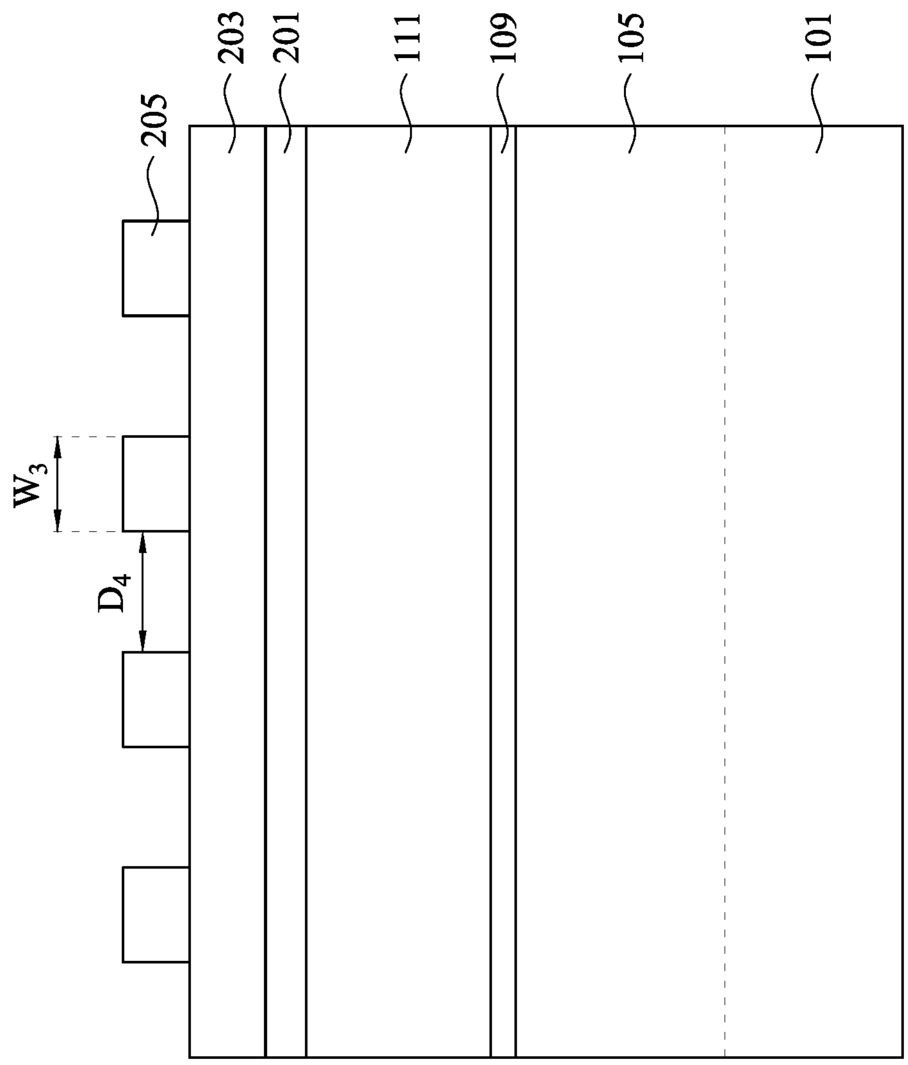

FIGS. 2A-2B, with FIG. 2B being a cross-sectional view of FIG. 2A along line B-B', illustrates a formation of hardmasks and a photoresist over the gate electrode material 111, in accordance with some embodiments. Once formed, the hardmasks and photoresist may be used to pattern the gate dielectric material 109 and the gate electrode material 111 to form a series of gate stacks 415 (illustrated in FIGS. 4A-4B) over the fins 105. The gate stacks 415, once patterned, will form multiple channel regions located on each side of the fins 105 beneath the gate dielectric material 109. In some embodiments, the patterning of the gate stacks 415 may be initiated by depositing a first hardmask 201 and a second hardmask 203 over the gate electrode material 111. According to some embodiments, the first hardmask 201 may be a material such as silicon oxide formed through a deposition process such as chemical vapor deposition or physical vapor deposition, or may be formed through a thermal oxidation process. However, any suitable material and process of formation may be utilized.

Once the first hardmask 201 has been formed, the second hardmask 203 is formed over the first hardmask 201. In an embodiment the second hardmask 203 comprises a dielectric material such as silicon nitride, titanium nitride, silicon oxynitride, combinations of these, or the like. The second hardmask 203 may be formed using a process such as: chemical vapor deposition, plasma enhanced chemical vapor deposition, atomic layer deposition, or the like. However, any other suitable material and method of formation may be utilized.

FIGS. 2A-2B also illustrate a placement and patterning of a first photoresist 205 over the second hardmask 203. In an embodiment the first photoresist 205 is a tri-layer photoresist, with a bottom anti-reflective coating (BARC) layer, an intermediate mask layer, and a top photoresist layer (not separately illustrated within FIGS. 2A-2B). However, any suitable type of photosensitive material or combination of materials may be utilized.

Once the first photoresist 205 has been placed over the second hardmask 203, the first photoresist 205 is patterned. In an embodiment the first photoresist 205 may be patterned by exposing a photosensitive material within the first photoresist 205 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the first photoresist 205 are different from the physical properties of the unexposed portions of the first photoresist 205. The first photoresist 205 may then be developed with, e.g., a developer (not separately illustrated), in order to separate the exposed portion of the first photoresist 205 from the unexposed portion of the first photoresist 205.

Additionally, while the placement of the first photoresist 205 has been described above, embodiments are not intended to be limited to using the first photoresist 205. Rather, any suitable patterning process may be utilized, such as by placing the first photoresist 205 and patterning the first photoresist 205 into mandrels. Spacers (not separately illustrated) may then be formed on opposing sides of the mandrels, and the mandrels may be removed, leaving behind the spacers, which may be used in place of the first photoresist 205. Any suitable process may be utilized to form the mask, and all such processes are fully intended to be included within the scope of the embodiments.

In an embodiment the first photoresist 205 may be patterned such that the first photoresist 205 can be used to form gate stacks 415 (not illustrated in FIGS. 2A-2B but illustrated and described below with respect to FIGS. 4A-4B). As such, the first photoresist 205 may be formed to have a third width $W_3$ of between about 20 nm and about 24 nm. Additionally, separate portions of the first photoresist 205 may be formed to be separated by a fourth distance $D_4$ of between about 42 nm and about 47 nm. However, any suitable dimensions may be utilized.

The advanced lithography process, method, and materials described above can be used in many applications, including the patterning of dielectric layers overlying conductive lines or the patterning of fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

Figure 3A:
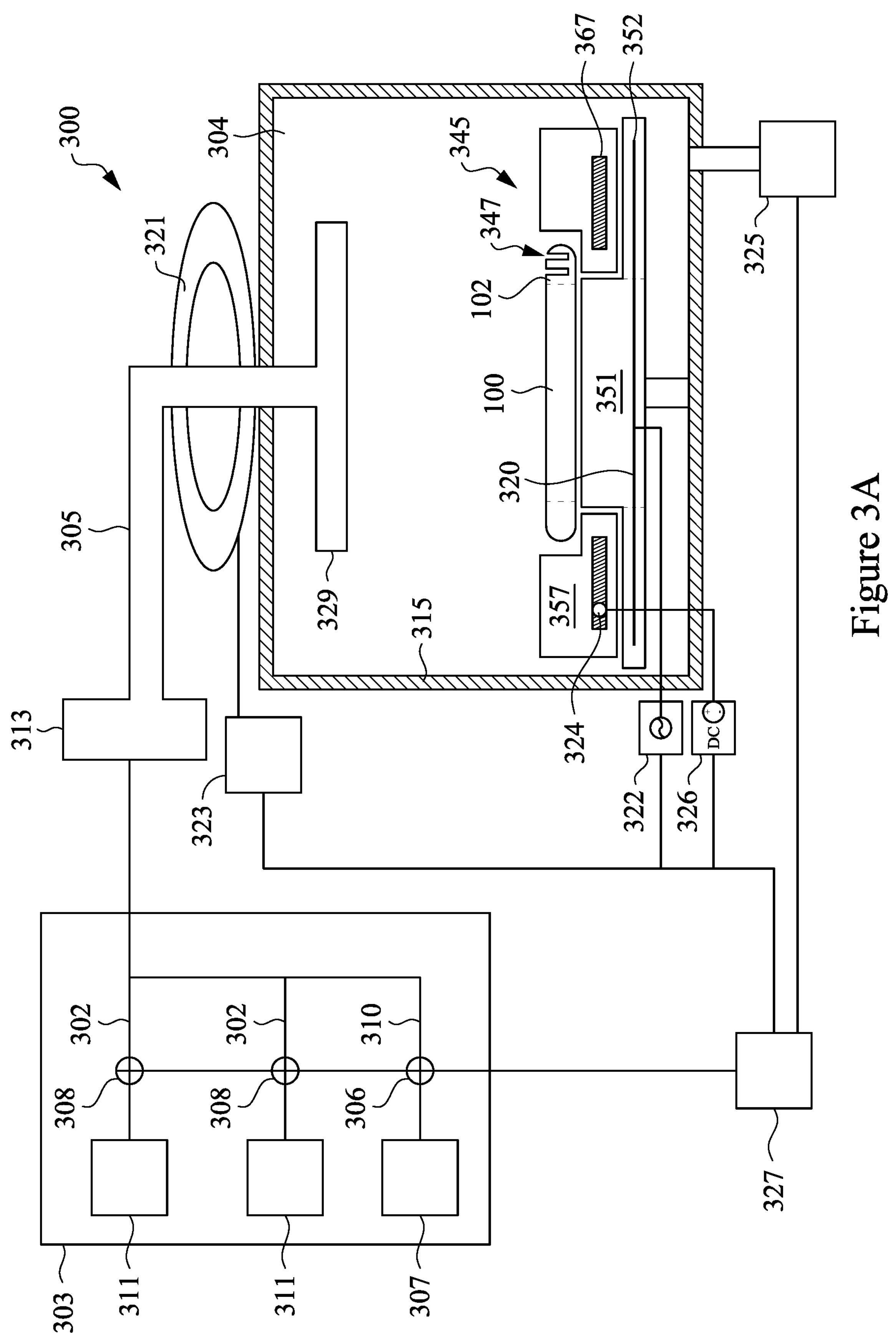
FIGS. 3A-3C illustrate an etching tool and an etching process in accordance with some embodiment.
Figure 3B:
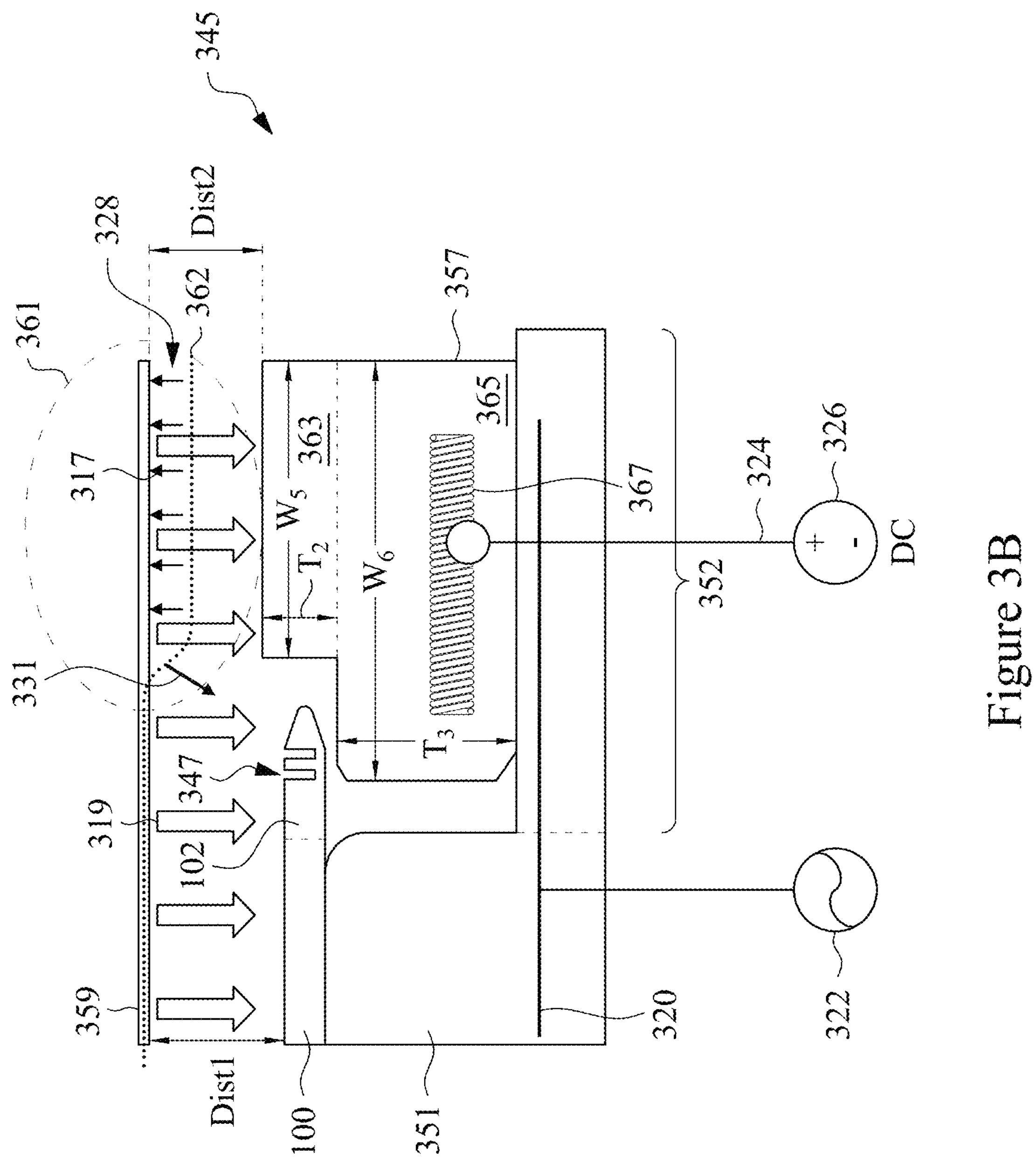
Figure 3C:
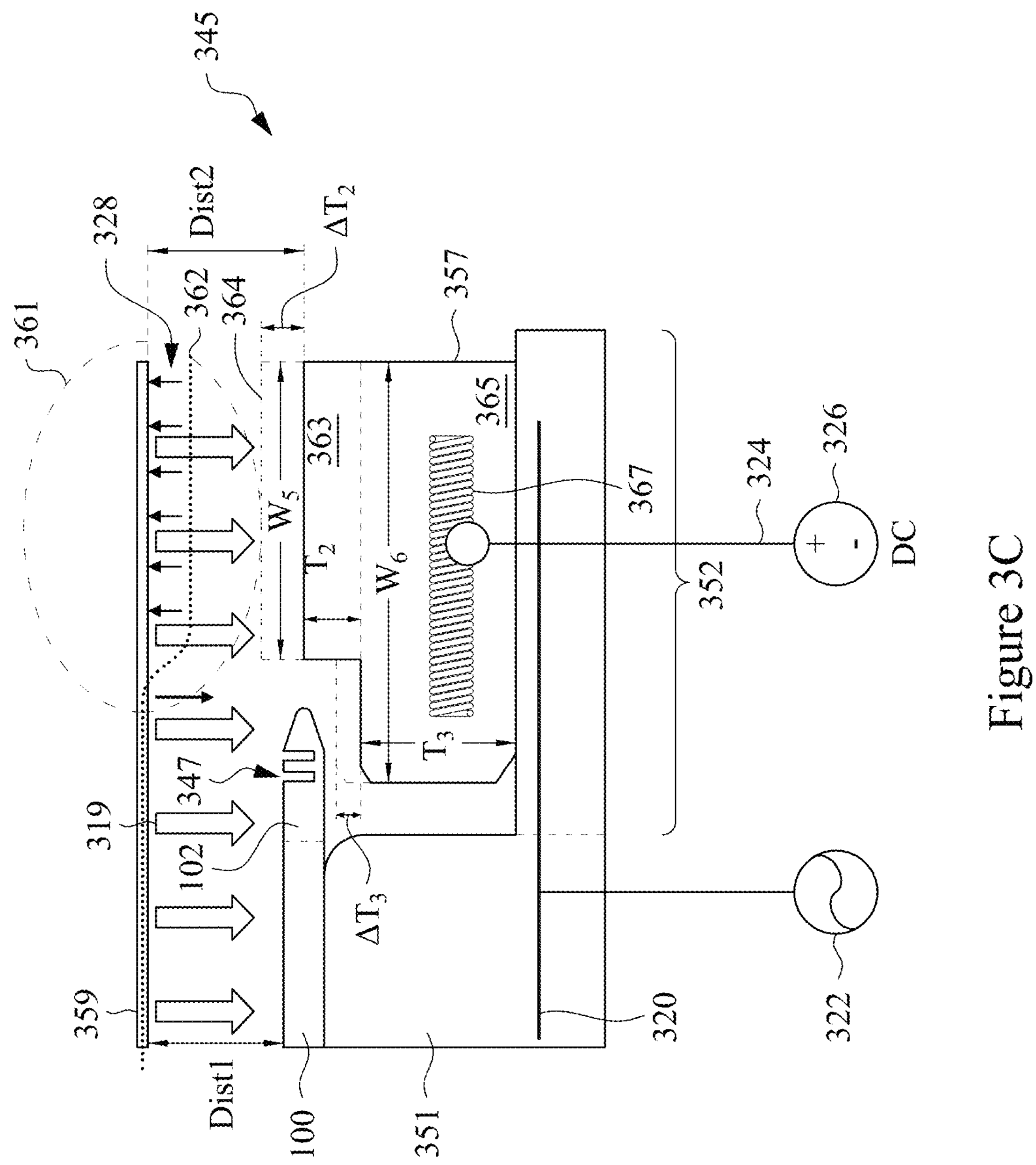

FIGS. 3A-3C illustrate a start of an etching process to pattern the gate dielectric material 109 and the gate electrode material 111 through the first photoresist 205 in order to form the gate stacks 415. The etching process may be initiated by placing the semiconductor wafer 100 (along with the gate electrode material 111, the gate dielectric material 109, the first hardmask 201 and the second hardmask 203) into an etching system 300 such as the one illustrated in FIG. 3A. In some embodiments, the etching system 300 may comprise an etchant delivery system 303 that may deliver one or more gaseous etchants to an etching chamber 304. The etchant delivery system 303 supplies the various desired etchants to the etching chamber 304 through an etchant controller 313 and a manifold 305. The etchant delivery system 303 may also help to control the flow rate of the etchant or etchants into the etching chamber 304 by controlling the flow and pressure of a carrier gas through the etchant delivery system 303.

In an embodiment the etchant delivery system 303 may include a plurality of etchant suppliers 311 along with a carrier gas supply 307. While only two etchant suppliers 311 are illustrated in FIG. 3A, this is done merely for clarity, as any suitable number of etchant suppliers 311 may be utilized, such as one etchant supplier 311 for each etchant desired to be used within the etching system 300. For example, in an embodiment in which five separate etchants will be utilized, there may be five of the etchant suppliers 311.

Each of the etchant suppliers 311 may be a vessel, such as a gas storage tank, that is located either locally to the etching chamber 304 or remotely from the etching chamber 304. In other embodiments, the etchant supplier 311 may be a facility that independently prepares and delivers the desired etchants. Any suitable source for the desired etchants may be utilized as the etchant supplier 311, and all such sources are fully intended to be included within the scope of the embodiments.

In some embodiments, each of the etchant suppliers 311 supply an etchant to the etchant controller 313 through first lines 302 with first valves 308. The first valves 308 are controlled by a controller 327 that controls and regulates the introduction of the various etchants and carrier gases to the etching chamber 304.

A carrier gas supply 307 may supply a desired carrier gas, or diluent gas, that may be used to help push or "carry" the various desired etchants to the etching chamber 304. The carrier gas may be an inert gas or other gas that does not react with the etchant itself or with by-products from the etchant's reactions. For example, the carrier gas may be nitrogen ($N_2$), helium (He), argon (Ar), combinations of these, or the like, although other suitable carrier gases may be utilized.

The carrier gas supply 307, or diluent supply, may be a vessel, such as a gas storage tank, that is located either locally to the etching chamber 304 or remotely from the etching chamber 304. In other embodiments, the carrier gas supply 307 may be a facility that independently prepares and delivers the carrier gas to the etchant controller 313. Any suitable source for the carrier gas may be utilized as the carrier gas supply 307, and all such sources are fully intended to be included within the scope of the embodiments. The carrier gas supply 307 may supply the desired carrier gas to the etchant controller 313 through a second line 310 with a second valve 306 that connects the carrier gas supply 307 to the first lines 302. The second valve 306 is also controlled by the controller 327 that controls and regulates the introduction of the various etchants and carrier gases to the etching chamber 304. Once combined, the lines may be directed towards the etchant controller 313 for a controlled entry into the etching chamber 304.

The etching chamber 304 may be any desired shape that may be suitable for dispersing the etchant and contacting the etchant with the substrate 101. In the embodiment illustrated in FIG. 3A, the etching chamber 304 has a cylindrical sidewall and a bottom. However, the etching chamber 304 is not limited to a cylindrical shape, and any other suitable shape, such as a hollow square tube, an octagonal shape, or the like, may be utilized. Furthermore, the etching chamber 304 may be surrounded by an etchant chamber housing 315 made of material that is inert to the various process materials. As such, while the etchant chamber housing 315 may be any suitable material that can withstand the chemistries and pressures involved in the etching process, in some embodiments the etchant chamber housing 315 may be steel, stainless steel, nickel, aluminum, alloys of these, combinations of these, and the like.

Additionally, the etching chamber 304 and the mounting platform 345 may be part of a cluster tool system (not shown). The cluster tool system may be used in conjunction with an automated handling system in order to position and place the semiconductor wafer 100 into the etching chamber 304 prior to the etching process, position and hold the semiconductor wafer 100 during the etching processes, and remove the semiconductor wafer 100 from the etching chamber 304 after the etching processes.

Within the etching chamber 304 is located a mounting platform 345 in order to position and control the semiconductor wafer 100 during the etching process. The mounting platform 345 may hold the semiconductor wafer 100 using electrostatic forces, clamps, vacuum pressure, combinations of these, or the like, and may also include heating and cooling mechanisms in order to control the temperature of the semiconductor wafer 100 during the processes.

Additionally, the mounting platform 345 may comprise a first electrode 320 coupled to an RF generator 322. The first electrode 320 may be electrically biased by the RF generator 322 (under control of the controller 327) at an RF voltage during the etching process. According to some embodiments, the RF generator 322 may provide an AC voltage. However, any suitable voltages may be used. By being electrically biased, the first electrode 320 is used to provide a bias to the incoming etchants and assist to ignite them into plasma and to help accelerate ions from a plasma sheath 359 (not illustrated in FIG. 3A but illustrated and described further below with respect to FIG. 3B) towards the semiconductor wafer 100 in a direction orthogonal to the upper surface of the semiconductor wafer 100.

Looking now at FIG. 3B in conjunction with FIG. 3A, wherein FIG. 3B illustrates the edge ring 357 when the edge ring 357 has been newly installed, the plasma sheath 359 may be located at first distance Dist1 from the semiconductor wafer 100 and a second distance Dist2 from the edge ring 357. Additionally, during operation, while ions from the plasma sheath 359 will be accelerated at a angle perpendicular to the semiconductor wafer 100 along a central region of the plasma sheath 359 (represented in FIG. 3B by the arrows labeled 319), at a peripheral region 361 of the plasma sheath 359, the plasma sheath 359 tends to curve downwards (represented by the dashed line labeled 362 in FIGS. 3B and 3C), resulting in a non-planar curvature within the peripheral region 361 of the plasma sheath 359. Such non-planar curvatures within the peripheral region 361 may also be referred to herein as bending or edge tilting of the plasma sheath 359. When the peripheral region 361 of the plasma sheath 359 is bending and ions from the plasma enter this peripheral region 361, the ions will still be accelerated, but will not be accelerated at an angle that is perpendicular to an upper surface of the semiconductor wafer 100. Rather, the ions will be accelerated at an angle that is not perpendicular to the upper surface of the semiconductor wafer 100 (represented in FIG. 3B by the arrow labeled 331). As such, recesses and/or openings etched into the edge region 102 of the semiconductor wafer 100 may be formed with non-vertical profiles.

As such, the first electrode 320 can be utilized during the etching process to help extend the plasma sheath 359 of the ions beyond the edge region 102 of the semiconductor wafer 100 and over the mounting platform 345. Extending the plasma sheath 359 beyond the edge region 102 of the semiconductor wafer 100 helps accelerate the ions from the plasma sheath 359 in a direction orthogonal to the upper surface of the semiconductor wafer 100, even in the edge region 102 of the semiconductor wafer 100. As such, the recesses 347 etched into the upper surface of the semiconductor wafer 100, including the recesses 347 etched into the edge region 102 of the semiconductor wafer 100, are formed with more vertical profiles.

Additionally, to further help shape the plasma sheath 359, the mounting platform 345 comprises a second electrode 324 coupled to a DC generator 326. The second electrode 324 may be electrically biased by the DC generator 326 (under control of the controller 327) at a DC voltage during the etching process. According to some embodiments, the DC generator 326 may apply a DC voltage. However, any suitable voltages may be used. Although the RF generator 322 and the DC generator 326 are illustrated as separate units, a single unit may be utilized to generate each of the AC voltage and the DC voltage according to some embodiments. By being electrically biased, the second electrode 324 is used during the etching process to provide an electric-field control 328 to maintain the plasma sheath 359 in a horizontal plane parallel to the upper surface of the edge ring 357 (represented in FIG. 3B by the arrows labeled 317). By maintaining the peripheral region 361 of the plasma sheath 359 in a horizontal plane helps to accelerate the ions entering the peripheral region 361 towards the edge region 102 of the semiconductor wafer 100 in a direction orthogonal to the upper surface of the semiconductor wafer 100. As such, the recesses 347 etched into the edge region 102 of the semiconductor wafer 100 are etched with vertical profiles.

By utilizing the additional control provided by the second electrode 324 and the DC generator 326, the recesses 347 formed within the edge region 102 may be formed to have more vertical sidewalls. For example, in recesses 347 formed in the edge region that have a depth that is between about 63.43 nm and about 84.72 nm, the recesses 347 can be formed to have substantially vertical profiles having angles that are between about 88.37° and about 91.63°, such as about 90.06° from a horizontal plane of an upper surface of the fins 105. However, any suitable dimensions may be utilized.

Looking closer at FIG. 3B, there is illustrated a close-up view of a portion of the mounting platform 345, with a portion of the semiconductor wafer 100 and the mounting platform 345 being illustrated. As can be seen, the mounting platform 345 in this view may comprise a number of different components to help hold and secure the semiconductor wafer 100 before, during, and after the etching process. In the illustrated embodiment, the mounting platform 345 comprises a first chuck 351, and an edge ring 357.

In some embodiments, the first chuck 351 is an electrostatic chuck that uses the first electrode 320 to not only generate and maintain the plasma during the etching process, but also uses the electrostatic forces generated by the first electrode 320 to hold and support the semiconductor wafer 100 to the mounting platform 345. As such, the first electrode 320 is incorporated into the first chuck 351. However, any suitable combination of chuck, such as clamping chucks or vacuum chucks, and first electrode 320 may be utilized.

According to some embodiments, the first chuck 351 comprises a chuck edge portion 352 (represented in FIG. 3B by the dashed line) that helps to allow for placement of the edge ring 357. In some embodiments, the first chuck 351 extends inwards in order to allow for alignment of the edge ring 357 with the chuck edge portion 352 extending below and helping to support the edge ring 357. As such, the precise dimensions of the chuck edge portion 352 depend at least in part upon the dimensions and shape of the edge ring 357.

In some embodiments, the chuck edge portion 352 may extend only a portion of the way below the edge ring 357. In such embodiments, a first base ring (not illustrated) may be placed adjacent to the chuck edge portion 352 and is used to help support the edge ring 357. In such embodiments, the first base ring may be made of a material such as quartz, although any other suitable material, such as silicon carbide or a ceramic, may also be used.

The edge ring 357 is located over the chuck edge portion 352 of the first chuck 351 and the first base ring (if present) and helps to provide a fine positioning for the semiconductor wafer 100 over the first chuck 351 while also containing the semiconductor wafer 100 from moving off of the first chuck 351 prior to an attachment of the semiconductor wafer 100 to the first chuck 351 (e.g., before application of the electrostatic forces when the first chuck 351 is an electrostatic chuck). In addition, the edge ring 357 also works to help shield the first chuck 351 from damage during the etching process. As such, in an embodiment the edge ring 357 is placed over the chuck edge portion 352 of the first chuck 351 and over the first base ring (if present), such that no portion of the top surface of the first chuck 351 is directly exposed to plasma during the etching process.

In an embodiment the edge ring 357 may be shaped in order to help position the semiconductor wafer 100. In a particular example, the edge ring 357 may have two sections such as a vertical support section 365 and a horizontal support section 363 (shown as being separated from each other in FIGS. 3B and 3C by a dashed line).

According to some embodiments, the horizontal support section 363 may have a fifth width $W_5$ of between about 24 mm and about 25 mm, and may have a second thickness $T_2$ greater than the thickness of the semiconductor wafer 100 of between about 2 mm and about 5 mm. Additionally, the vertical support section 365 may have a sixth width $W_6$ of between about 26 mm and about 27 mm, and may have a third thickness $T_3$ of between about 0.3 mm and about 0.7 mm. Combined, the second thickness $T_2$ and the third thickness $T_3$ may have a combined thickness of between about 2.3 mm and about 5.7 mm. However, any suitable dimensions may be used.

According to some embodiments, the edge ring 357 may be made of a material that can facilitate the electric-field control 328 generated by the first electrode 320 and the second electrode 324 during the etching process, and may be electrically isolated from the first electrode 320. For example, in one embodiment the edge ring 357 may be made of a high electron mobility material such as silicon doped with nitrogen (silicon nitride), silicon doped with carbon (silicon carbide), silicon doped with fluorine (silicon fluoride), silicon doped with oxygen (silicon oxide), combinations of these, or the like. By forming the edge ring 357 out of materials with a high electron mobility (rather than materials with low electron mobility such as quartz or diamond-zincblende structures), the electric field generated by the etching chamber 304 will be extended further out over the edge ring 357, as described further below.

In an embodiment in which the high electron mobility material is silicon doped with nitrogen, the nitrogen may have an atomic concentration of between about 55% and about 65%, such as about 60%. In an embodiment in which the high electron mobility material is silicon doped with carbon, the carbon may have an atomic concentration of between about 45% and about 55%, such as about 50%. In an embodiment in which the high electron mobility material is silicon doped with fluorine, the fluorine may have an atomic concentration of between about 70% and about 80%, such as about 75%. Finally, in an embodiment in which the high electron mobility material is silicon doped with oxygen, the oxygen may have an atomic concentration of between about 55% and about 65%, such as about 60%. However, any suitable concentration of dopants may be utilized.

FIG. 3B further illustrates the edge ring 357 comprises an electronic field coil 367, according to some embodiments. The electronic field coil 367 generates and/or modifies the electric-field control 328 in response to the DC voltage applied to the second electrode 324. In some embodiments, the electric-field control 328 may be generated by a combination of the AC voltage applied to the first electrode 320 and the DC voltage applied to the second electrode 324. However, in some embodiments, the electric-field control 328 may be generated by either of the AC voltage applied to the first electrode 320 and the DC voltage applied to the second electrode 324, independent from the other.

FIG. 3C illustrates the close-up view of the portion of the mounting platform 345 during operation according to some embodiments, wherein the edge ring 357 is no longer newly installed, but has instead been worn over time and after repeated use (e.g., after multiple semiconductor wafers, including, e.g., a second semiconductor wafer, have been placed, etched, and removed for further processing). In particular, the edge ring 357 may become worn over time from repeated exposure to the etchants released within the etching chamber 304, thereby reducing the thicknesses and/or modifying the shape of the edge ring 357. FIG. 3C illustrates the second thickness $T_2$ and the third thickness $T_3$ having been reduced from their original thicknesses by differential thicknesses $\Delta T_2$ and $\Delta T_3$, respectively, while the second distance Dist2 is increased (and the first distance Dist1 remains the same).

To help account for this reduction in thicknesses, as subsequent semiconductor wafers, such as a second semiconductor wafer, are processes, the electric-field control 328 can be incrementally changed over time and/or after repeated use of the edge ring 357 by applying a suitable DC voltage that compensates for the differential thicknesses $\Delta T_2$ and $\Delta T_3$, and/or shape of the edge ring 357. As such, the DC voltage applied during operation maintains the plasma sheath 359 in a plane parallel to the upper surfaces of the semiconductor wafer 100 and the edge ring 357 even as the overall thickness and/or shape of the edge ring 357 becomes worn. In some embodiments, the DC voltage may be applied to the second electrode 324 during operation to control the electric-field control 328, wherein the DC voltage is based on the wear of the edge ring 357. According to some embodiments, when the thicknesses of the edge ring 357 have been reduced by the differential thicknesses $\Delta T_2$ and $\Delta T_3$, the DC voltage may be modified. However, any suitable voltages may be used.

Returning now to FIG. 3A, in some embodiments the etching chamber 304 comprises a showerhead 329. In an embodiment the showerhead 329 receives the various etchants from the manifold 305 and helps to disperse the various etchants into the etching chamber 304. The showerhead 329 may be designed to evenly disperse the etchants in order to minimize undesired process conditions that may arise from uneven dispersal. In an embodiment the showerhead 329 may have a circular design with openings dispersed evenly around the showerhead 329 to allow for the dispersal of the desired etchants into the etching chamber 304. However, any suitable method of introducing the desired etchants, such as entry ports, may be utilized to introduce the desired etchants into the etching chamber 304.

The etching chamber 304 also comprises an upper electrode 321, for use as a plasma generator. In an embodiment the plasma generator may be a transformer coupled plasma generator and may be, e.g., a coil. The coil may be attached to a second RF generator 323 that is utilized to provide power to the upper electrode 321 (under control of the controller 327) in order to ignite the plasma during introduction of the reactive etchants.

However, while the upper electrode 321 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

The etching chamber 304 may also be connected to a vacuum pump 325. In an embodiment the vacuum pump 325 is under the control of the controller 327, and may be utilized to control the pressure within the etching chamber 304 to a desired pressure. Additionally, once the etching process is completed, the vacuum pump 325 may be utilized to evacuate the etching chamber 304 in preparation for removal of the semiconductor wafer 100.

Additionally while a number of particular parts of the etching system 300 have been described above, other suitable parts may also be included. For example, endpoint mounts, liners, and any other parts that may help operate or control the etching process may also be included. All such parts are fully intended to be included within the scope of the embodiments.

With reference now to FIGS. 3A to 3C, to begin to pattern the gate electrode material 111 and the gate dielectric material 109, the process may be started by placing the semiconductor wafer 100 onto the mounting platform 345, wherein the placement of the semiconductor wafer 100 is guided at least in part through the use of the edge ring 357 in order to align the semiconductor wafer 100 with the first chuck 351. Once the semiconductor wafer 100 has been placed onto the first chuck 351, the substrate may be attached to the first chuck 351 using an attachment process. In an embodiment in which the first chuck 351 is an electrostatic chuck, the semiconductor wafer 100 may be attached to the first chuck 351 by applying a first current (e.g., alternating current) to the first electrode 320 such that electrostatic forces will apply a force to hold the semiconductor wafer 100 to the attachment surface of the first chuck 351. During operation, the application of the first current to the first electrode 320 may be utilized to extend a plasma sheath 359 formed within the etching chamber 304 beyond the edge region 102 of the semiconductor wafer 100.

According to some embodiments, a second current (e.g., direct current) may be applied to the second electrode 324 during operation. During operation of the etching chamber 304, the second current may be used to control the plasma sheath 359 to maintain a planar orientation that is parallel to the upper surfaces of the semiconductor wafer 100 and the edge ring 357.

Once the semiconductor wafer 100 has been placed and is attached to the first chuck 351, the controller 327 may initiate the etching process by connecting one or more of the etchant suppliers 311 and another one of the carrier gas supply 307 to the etching chamber 304 to introduce a first etching combination of etchants. While the precise etchants utilized are dependent at least in part upon the materials chosen for the gate dielectric material 109, the gate electrode material 111, the first hardmask 201, and the second hardmask 203, in an embodiment the first etching combination of etchants may comprise a combination of hydrogen chloride (HCl) and oxygen ($O_2$) along with a second diluent such as nitrogen ($N_2$). In an embodiment the oxygen is introduced at a rate of between about 2 sccm and about 10 sccm, such as about 5 sccm, and the nitrogen is introduced at a rate of between about 5 sccm and about 25 sccm, such as about 15 sccm, and the hydrogen chloride is introduced as a rate of between about 5 sccm and about 15 sccm, such as about 10 sccm. However, any suitable etchant or combination of etchants and diluents may be utilized.

Within the etching chamber 304, the first etching combination of etchants may be ignited into plasma for a reactive ion etch process. In an embodiment the first etching combination of etchants may be ignited by the controller 327 sending a signal to the second RF generator 323 to supply to the upper electrode 321 a power of between about 150 W and about 550 W, such as about 350 W. The controller 327 may also send a signal to the RF generator 322 in order to supply an AC voltage to the first electrode 320 within the first chuck 351. In an embodiment the RF generator 322 supplies an AC voltage of between about 60 V and about 180 V. However, any suitable voltages may be used.

In some embodiments, the controller 327 may also send a signal to the DC generator 326 in order to supply a DC voltage to the second electrode 324 at the edge ring 357, based at least in part on the length of time the edge ring 357 has been installed or on the thicknesses of the edge ring 357. For example, when the edge ring 357 has been newly installed, the DC generator 326 supplies a first DC voltage. However, when the edge ring 357 has been reduced in thickness by the differential thicknesses $\Delta T_2$ and $\Delta T_3$, the DC generator 326 supplies a second, different DC voltage.

By using the RF generator 322 to supply the AC voltage to the first electrode 320 within the first chuck 351, the electric field and the plasma sheath 359 (represented in FIGS. 3B and 3C by a solid line) will be created over the surface of the semiconductor wafer 100 facing away from the first chuck 351. The electric-field control 328 and the plasma sheath 359 will help move and accelerate ions from the plasma towards the surface to be etched (e.g., the second hardmask 203, the first hardmask 201, the gate electrode material 111, and the gate dielectric material 109).

However, as discussed above, and as can be seen in FIGS. 3B and 3C, the electric field and the plasma sheath 359 tend to bend toward the semiconductor wafer 100 and the edge ring 357 at the peripheral region 361 of the plasma sheath 359. As such, the plasma sheath 359 will curve downwards, resulting in a non-planar curvature within the peripheral region 361 of the plasma sheath 359 (represented in FIGS. 3B and 3C by the dashed line labeled 362). Without compensating for this bending, when ions from the plasma enter this peripheral region 361 of the plasma sheath 359, the plasma sheath 359 will still accelerate the ions, but will not accelerate them at an angle that is perpendicular to the semiconductor wafer 100. Rather, the ions will be accelerated at an angle that is not perpendicular to the semiconductor wafer 100, resulting in a pattern that is angled with respect to the semiconductor wafer 100 instead of the desired perpendicular pattern transfer. Further, not only will there be a non-perpendicular transfer of the pattern, but this non-perpendicular transfer will only occur within the edge region 102 of the semiconductor wafer 100. In particular, within the central region 104 of the semiconductor wafer 100, the plasma sheath 359 will have a relatively planar shape, allowing the ions that enter the plasma sheath 359 at this location to be accelerated perpendicularly towards the semiconductor wafer 100. As such, between the perpendicular acceleration in the central region 104 and the non-perpendicular acceleration in the edge region 102 of the semiconductor wafer 100, there will be a non-uniform effect across the semiconductor wafer 100 depending on the distance from the peripheral region 361 of the plasma sheath 359.

However, by forming the edge ring 357 as described above, and by applying the second voltage to the edge ring 357, the plasma sheath 359 may be prevented from curving downward and remains planar over the semiconductor wafer 100 and the edge ring 357. As such, any of the ions that enter the peripheral region 361 of the plasma sheath 359 are accelerated at a perpendicular angle to impact the layers of the semiconductor wafer 100 to be etched (e.g., the second hardmask 203, the first hardmask 201, the gate electrode material 111, and the gate dielectric material 109) or are directed to impact the edge ring 357.

Additionally, by extending the plasma sheath 359 such that the peripheral region 361 is located over the edge ring 357 and by maintaining the planar orientation, instead of ions being accelerated towards the edge region 102 at a non-perpendicular angle, the ions accelerated towards the edge region 102 will be directed closer to a perpendicular angle with the semiconductor wafer 100. As such, a more perpendicular transfer of the desired pattern will occur, and a more uniform patterning process across the semiconductor wafer 100 may be obtained.

Additionally, as illustrated in FIG. 3C by the dashed profile 364, over time and with repeated use of the edge ring 357, materials of the edge ring 357 may be incrementally consumed by the various etching processes experienced by the edge ring 357. As such, the edge ring 357 eventually becomes worn with age and the thickness and/or a shape of the edge ring 357 will deteriorate over time. As the second thickness $T_2$, the third thickness $T_3$, and/or the shape of the edge ring 357 deteriorate, the second voltage may be increased to compensate for a loss in thickness and/or change in the shape of the edge ring 357. As such, the plasma sheath 359 remains planar over the semiconductor wafer 100 and the edge ring 357 even as the edge ring 357 becomes worn.

According to some embodiments, the second voltage may be increased by multiplying a time in service of the edge ring 357 by a voltage/time factor, a shape factor, and/or a thickness factor. The time in service depends on the materials of the edge ring 357, an original thickness of the edge ring 357, and the types and concentrations of the etchants used in the various etching processes. According to some embodiments, by modifying the second voltage as the edge ring 357 ages, the edge ring 357 may have an increased time in service that exceeds about 800 hours. As such, the edge ring 357 may be reused many times before having to be replaced or may even outlast the other parts of the mounting platform 345.

Figure 4A:
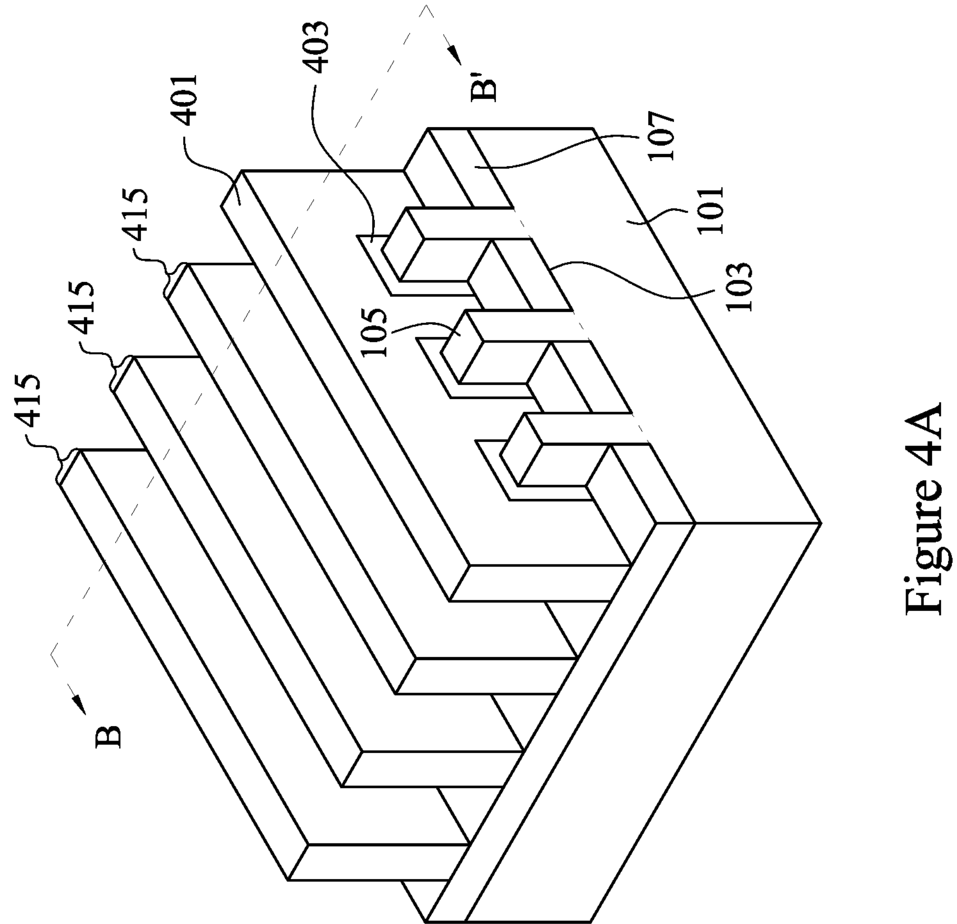
FIGS. 4A-4B illustrate a formation of a gate electrode in accordance with some embodiments.
Figure 4B:
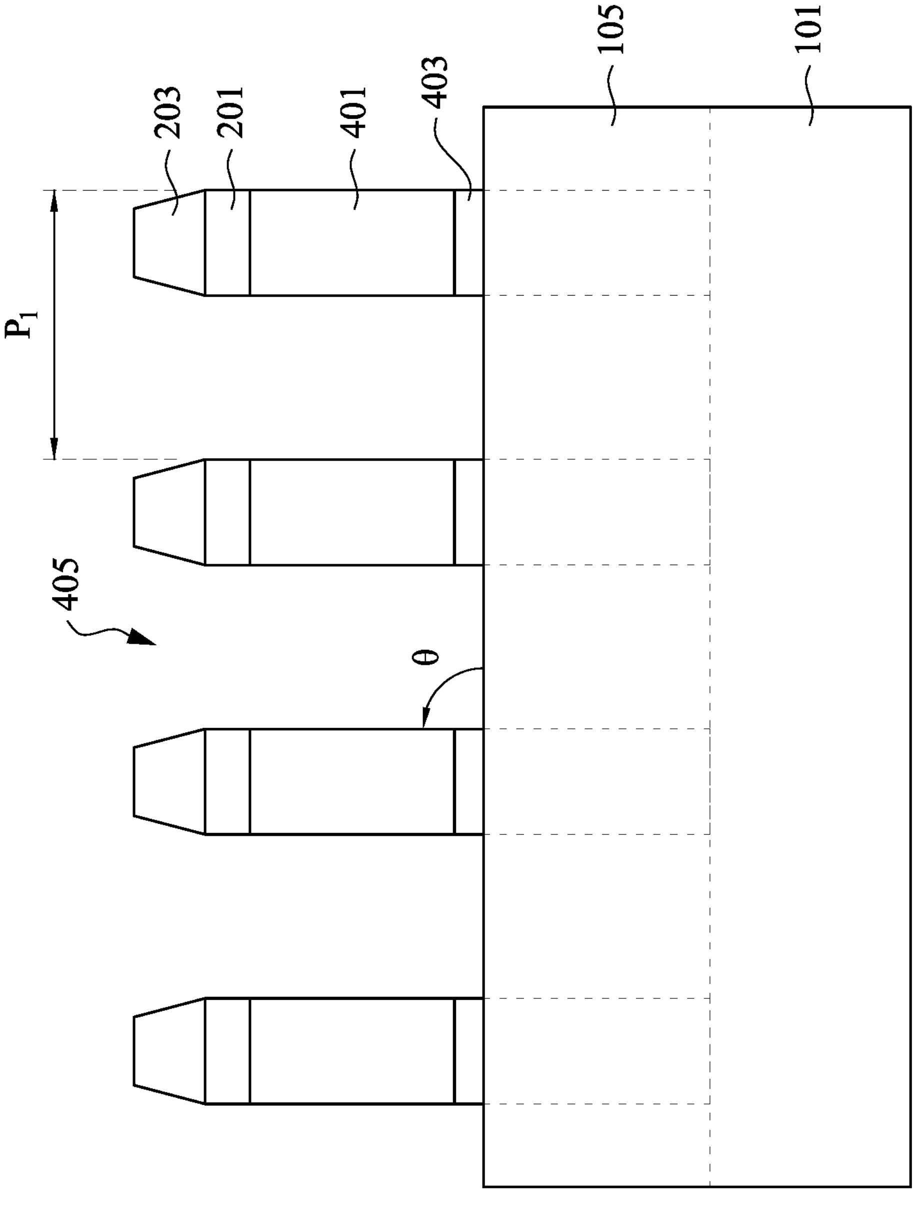

Continuing with FIGS. 3A-3C and with reference to FIGS. 4A-4B, once the plasma has been ignited and the ions are being directed towards the semiconductor wafer 100, the process conditions as described above are maintained in order to expose the second hardmask 203 to the plasma generated within the etching chamber 304 and remove exposed portions of the second hardmask 203. Once the pattern of the first photoresist 205 has been transferred to the second hardmask 203, the etching process may be continued to transfer the pattern to the first hardmask 201. In an embodiment in which the first etching combination of etchants will etch the first hardmask 201 as well as the second hardmask 203, the etching process may simply be continued without changing the first etching combination of etchants. In another embodiment, if desired, the first etching combination of etchants may be changed by the controller 327 connecting another one of the one or more of the etchant suppliers 311 and another one of the carrier gas supply 307 to the etching chamber 304 to introduce a second etching combination of etchants. However, any suitable method may be utilized.

Similarly, once the pattern of the second hardmask 203 has been transferred to the first hardmask 201, the etching process may be continued to transfer the pattern to the underlying gate electrode material 111 and form gate electrodes 401. In an embodiment in which the first etching combination of etchants will etch the gate electrode material 111 as well as the first hardmask 201 and the second hardmask 203, the etching process may simply be continued without changing the first etching combination of etchants. In another embodiment, if desired, the first etching combination of etchants (or second etching combination of etchants if the second etching combination of etchants has been used), may be changed by the controller 327 connecting another one of the one or more of the etchants suppliers 311 and another one of the carrier gas supply 307 to the etching chamber 304 to introduce a third etching combination of etchants. However, any suitable method may be utilized.

Finally, once the pattern of the first hardmask 201 has been transferred to the gate electrode material 111 to form the gate electrodes 401, the etching process may be continued to transfer the pattern to the gate dielectric material 109 in order to form gate dielectrics 403 and gate stacks 415 (from the gate dielectrics 403 and the gate electrodes 401). In an embodiment in which the first etching combination of etchants will etch the gate dielectric material 109 as well as the gate electrode material 111, the first hardmask 201, and the second hardmask 203, the etching process may simply be continued without changing the first etching combination of etchants. In another embodiment, if desired, the first etching combination of etchants (or second etching combination of etchants or third etching combination of etchants if the second etching combination of etchants or the third etching combination of etchants has been used), may be changed by the controller 327 connecting another one of the one or more of the etchants suppliers 311 and another one of the carrier gas supply 307 to the etching chamber 304 to introduce a fourth etching combination of etchants. However, any suitable combination of etchants may be utilized.

At this point, if desired, the first photoresist 205 may be removed. In an embodiment the first photoresist 205 may be removed through a thermal process such as ashing, whereby the temperature of the first photoresist 205 is increased until the first photoresist 205 suffers a thermal breakdown and may be removed. However, any suitable removal process, such as a wet or dry etching process, may be used to remove the first photoresist 205.

By utilizing the etching process as described above along with the edge ring 357, the ion flux of the ions utilized during the etching process may be extended beyond the semiconductor wafer 100. As such, crowding of the ion flux that occurs near the edges of the semiconductor wafer 100 may be moved to a point that is over the edge ring 357 and not over the semiconductor wafer 100. Furthermore the ion flux will have less crowding over the semiconductor wafer 100 which allows for a more even flux and less variation in the gate electrodes 401 adjacent to the edge region 102 of the semiconductor wafer 100 that is induced by the uneven ion flux.

FIGS. 4A-4B illustrate an embodiment in which the etching process described above with respect to FIGS. 3A-3C is utilized to form four of the gate electrodes 401 over the fins 105, with FIG. 4B being a cross-sectional view of FIG. 4A along line B-B'. For example, in an embodiment in which the edge ring 357 is utilized as described above, the gate electrodes 401 may have a first pitch Pi of between about 65 nm and about 68 nm. Additionally, openings 405 between the gate electrodes 401 formed by the etching process may also have an aspect ratio of larger than about 3.5 or 4.0.

FIG. 4B further illustrates that, according to some embodiments, the openings 405 in the edge region 102 of the semiconductor wafer 100 are the recesses 347 (described above with respect to FIGS. 3A-3B). As such, the openings 405 formed within the edge region 102 of the semiconductor wafer 100 may be formed with substantially vertical profiles. According to some embodiments, the openings 405 can be formed with vertical profiles having angles θ that are between about 88° and about 92°, such as about 88.37°, 91.63°, or 90.06°, from an upper surface of the fins 105.

However, while the etching tools and processes have been described above with respect to an etching of a gate electrode and gate dielectric, these descriptions of this embodiment are not intended to limit the embodiments to this description. Rather, the processes described above could be applied to any suitable etching process. For example, the etching process may be performed with respect to a process to etch dielectric materials located over metallization layers used to interconnect conductive lines. Any suitable etching process may utilize the above description, and all such processes are fully intended to be included within the scope of the embodiments.

Figure 5:
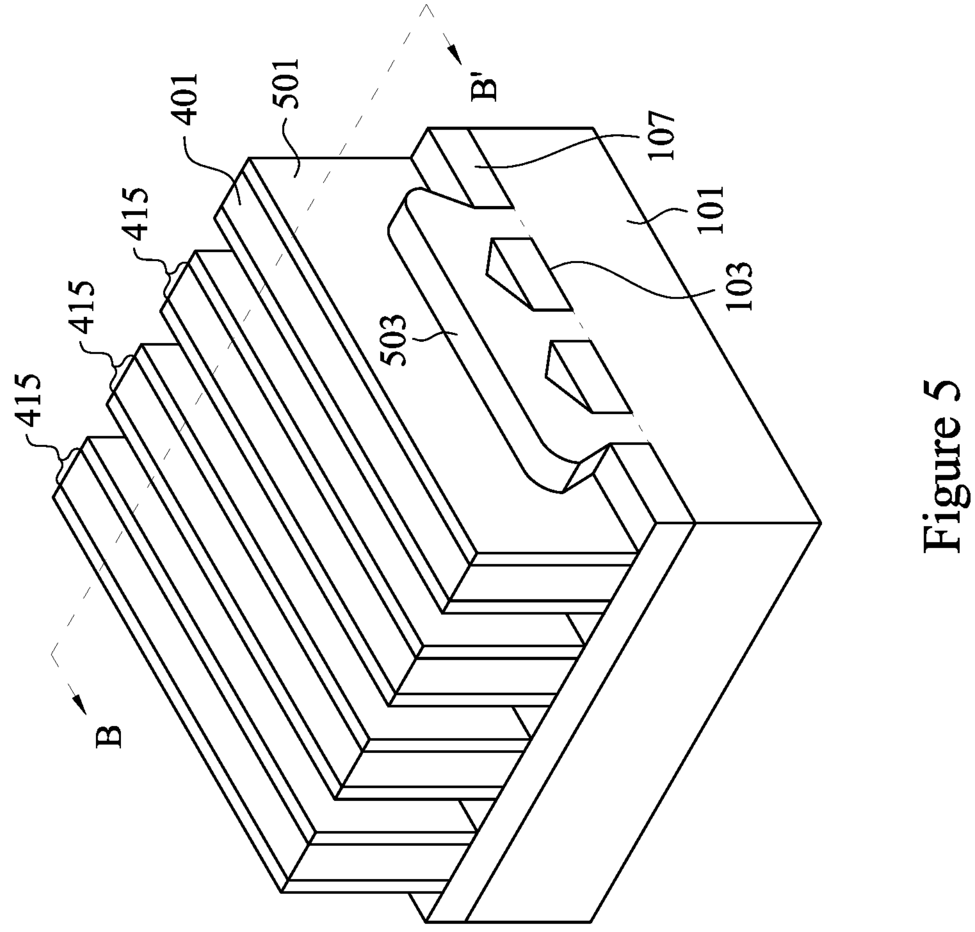
FIG. 5 illustrates a formation of a source/drain region after the formation of the gate electrodes in accordance with some embodiments.

FIG. 5 illustrates that, once the gate stacks 415 have been patterned, the first hardmask 201 and the second hardmask 203 may be removed, first spacers 501 may be formed, and the fins 105 may have a portion that is uncovered by the gate stacks 415 and the first spacers 501 removed. In an embodiment the first hardmask 201 and the second hardmask 203 are removed using an etching process such as a wet etch or a dry etch. However, any suitable removal process may be used.

The first spacers 501 may be formed on opposing sides of the gate stacks 415. The first spacers 501 are typically formed by blanket depositing a spacer layer (not separately illustrated in FIG. 5) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 107. The first spacers 501 may then be patterned, such as by one or more etches to remove the spacer layer from the horizontal surfaces of the structure, to form the first spacers 501.

FIG. 5 also illustrates a removal of the fins 105 from those areas not protected by the gate stacks 415 and the first spacers 501. This removal may be performed by a reactive ion etch (RIE) using the gate stacks 415 and the first spacers 501 as masks, or by any other suitable removal process. The removal may be continued until the fins 105 are either planar with or below the surface of the first isolation regions 107.

Once the fins 105 have been removed from those areas not protected by the gate stacks 415, source/drain regions 503 may be regrown from the exposed portions of the substrate 101 and in contact with each of the fins 105. In an embodiment the source/drain regions 503 may be regrown to form a stressor that will impart a stress to the channel regions of the fins 105 located underneath the gate stacks 415. In an embodiment wherein the fins 105 comprise silicon and the FinFET is a p-type device, the source/drain region 503 may be regrown through a selective epitaxial process with a material, such as silicon germanium that has a different lattice constant than the fins 105. The epitaxial growth process may use precursors such as silane, dichlorosilane, germane, and the like, and may continue for between about 5 minutes and about 120 minutes. The source/drain regions 503 may be formed to have a height above the upper surface of the first isolation region 107 of between about 5 nm and about 250 nm.

Figure 6:
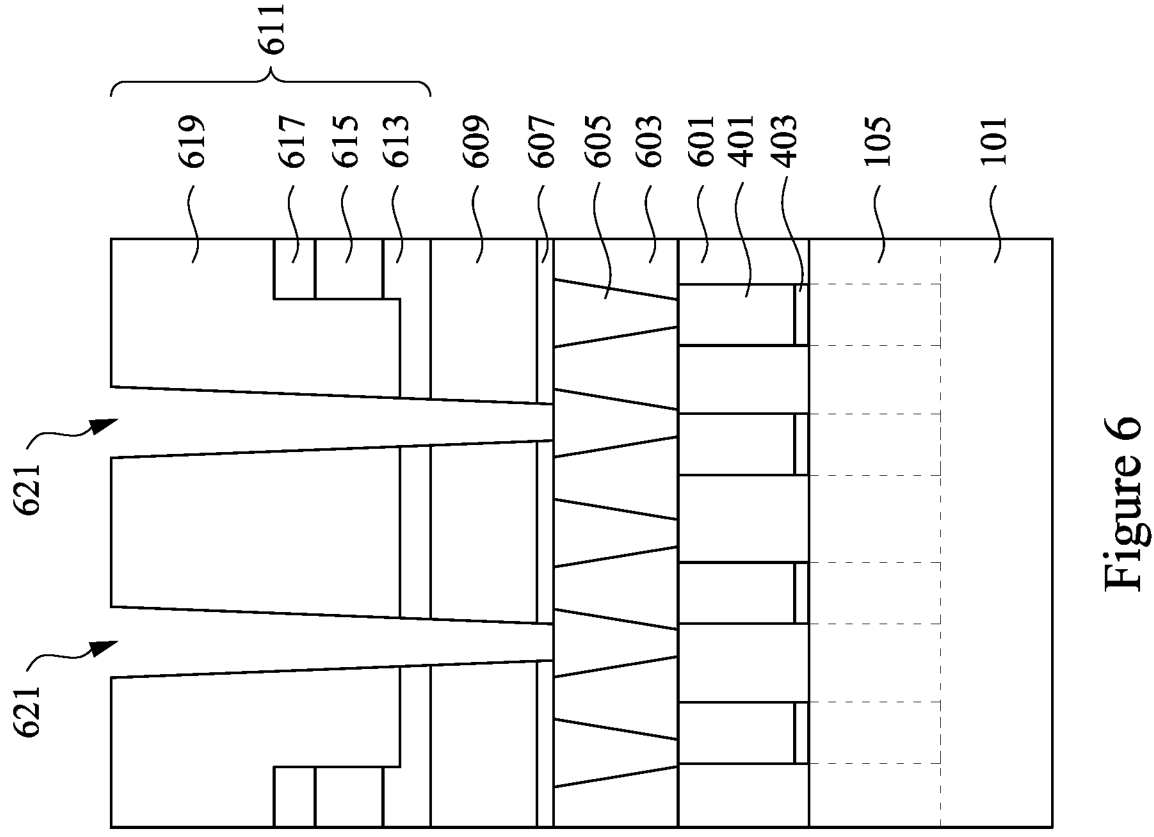
FIG. 6 illustrates formation of second openings using the deposition chamber, in accordance with some embodiments.

FIG. 6 illustrates that, while the tools and processes described above with respect to FIGS. 1A-5 may be used to form the gate electrodes 401, the embodiments are not limited to these precise processes. For example, in the embodiments illustrated in FIG. 6, once the gate electrodes 401 have been patterned, the first spacers 501 and the source/drain regions 503 have been formed, a first ILD layer 601 may be deposited and planarized, and a second ILD layer 603 and gate contacts 605 may be formed to make electrical connection to one or more of the gate electrodes 401. In an embodiment the first ILD layer 601 and the second ILD layer 603 may comprise a material such as boron phosphorous silicate glass (BPSG), although any suitable dielectrics may be used, using a deposition process such as PECVD, although other processes, such as LPCVD may be used. Once the second ILD layer 603 has been deposited, the gate contacts 605 may be formed using, e.g., a damascene or dual damascene process.

Additionally, once the gate contacts 605 have been formed, a first etch stop layer 607 and a third ILD layer 609 may be deposited over the gate contacts 605. In an embodiment the first etch stop layer 607 may be a material such as silicon nitride, silicon oxynitride, silicon oxide, combinations of these, or the like, while the third ILD layer 609 may be a material similar to the second ILD layer 603. However, any suitable materials may be utilized.

Once the third ILD layer 609 has been deposited, the third ILD layer 609 may be patterned using, e.g., a first photoresist 611. In an embodiment the first photoresist 611 may be, e.g., a tetralayer photoresist, wherein the first photoresist 611 comprises a first BARC layer 613, an intermediate mask layer 615, a second BARC layer 617, and a top photosensitive layer 619. However, any suitable photoresist and any suitable number of layers may be utilized.

The first BARC layer 613 is applied in preparation for an application of the top photosensitive layer 619. The first BARC layer 613, as its name suggests, works to prevent the uncontrolled and undesired reflection of energy (e.g., light) back into the overlying top photosensitive layer 619 during an exposure of the top photosensitive layer 619, thereby preventing the reflecting light from causing reactions in an undesired region of the top photosensitive layer 619. Additionally, the first BARC layer 613 may be used to provide a planar surface, helping to reduce the negative effects of the energy impinging at an angle.

The intermediate mask layer 615 may be placed over the first BARC layer 613. In an embodiment the intermediate mask layer 615 is a hard mask material such as silicon nitride, oxides, oxynitrides, silicon carbide, combinations of these, or the like. The hard mask material for the intermediate mask layer 615 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may be utilized. Any suitable method or combination of methods to form or otherwise place the hardmask material may be utilized, and all such methods or combinations are fully intended to be included within the scope of the embodiments. The intermediate mask layer 615 may be formed to a thickness of between about 100 Å and about 800 Å, such as about 300 Å.

The second BARC layer 617 is deposited in order to improve the adhesion between the intermediate mask layer 615 and the overlying top photosensitive layer 619. In an embodiment the second BARC layer 617 may be similar to the first BARC layer 613, although in other embodiments, the second BARC layer 617 may be different.

In some embodiments, the second BARC layer 617, the intermediate mask layer 615, and a portion of the first BARC layer 613 are patterned a first time in order to prepare for the placement of the top photosensitive layer 619 (in, e.g., a double patterning process). In an embodiment the second BARC layer 617, the intermediate mask layer 615, a the portion of the first BARC layer 613 are patterned the first time using a photosensitive layer (not separately illustrated in FIG. 6) that is placed, imaged, and developed, which is then used as a mask for one or more etching processes to remove material of the second BARC layer 617 and the intermediate mask layer 615 and also removing a portion, but not all, of the first BARC layer 613. Once the photosensitive layer has been used, the photosensitive layer may be removed using, e.g., an ashing process.

Once the second BARC layer 617 and the intermediate mask layer 615 have been patterned the first time, the top photosensitive layer 619 is applied over the second BARC layer 617 using, e.g., a spin-on process, and includes a photoresist polymer resin along with one or more photoactive compounds (PACs) in a photoresist solvent. The PACs will adsorb the patterned light source and generate a reactant in those portions of the top photosensitive layer 619 that are exposed, thereby causing a subsequent reaction with the photoresist polymer resin that can be developed in order to replicate the patterned energy source within the top photosensitive layer 619.

Once each of the first BARC layer 613, the intermediate mask layer 615, the second BARC layer 617 and the top photosensitive layer 619 have been applied, the top photosensitive layer 619 is exposed to a patterned energy source (e.g., light such as an extreme ultraviolet (EUV) light) and developed in order to form second openings 621 (e.g., line openings) in the top photosensitive layer 619.

Once the top photosensitive layer 619 has been patterned, the top photosensitive layer 619 is utilized to extend the second openings 621 through the first BARC layer 613, the third ILD layer 609, and the first etch stop layer 607 to expose portions of the gate contacts 605. In an embodiment the extension of the second openings 621 may be performed using one or more anisotropic etching processes, using the etching system 300 as described above with respect to FIGS. 3A-3C, wherein a voltage is applied to the edge ring 357 in order to help modify the outer edges of the plasma sheath 359 so that each of the second openings 621 throughout the semiconductor wafer 100 (including those second openings 621 formed in the edge region 102) may be formed in a nearly perpendicular manner (e.g., with an angle of between about 88.37° and about 91.63°). Once the second openings 621 have been formed, the first photoresist 611 may be removed (using, e.g., an ashing process), and the second openings 621 may be filled with, e.g., a conductive material (not separately illustrated) using, e.g., a damascene or dual damascene process.

Figure 7:
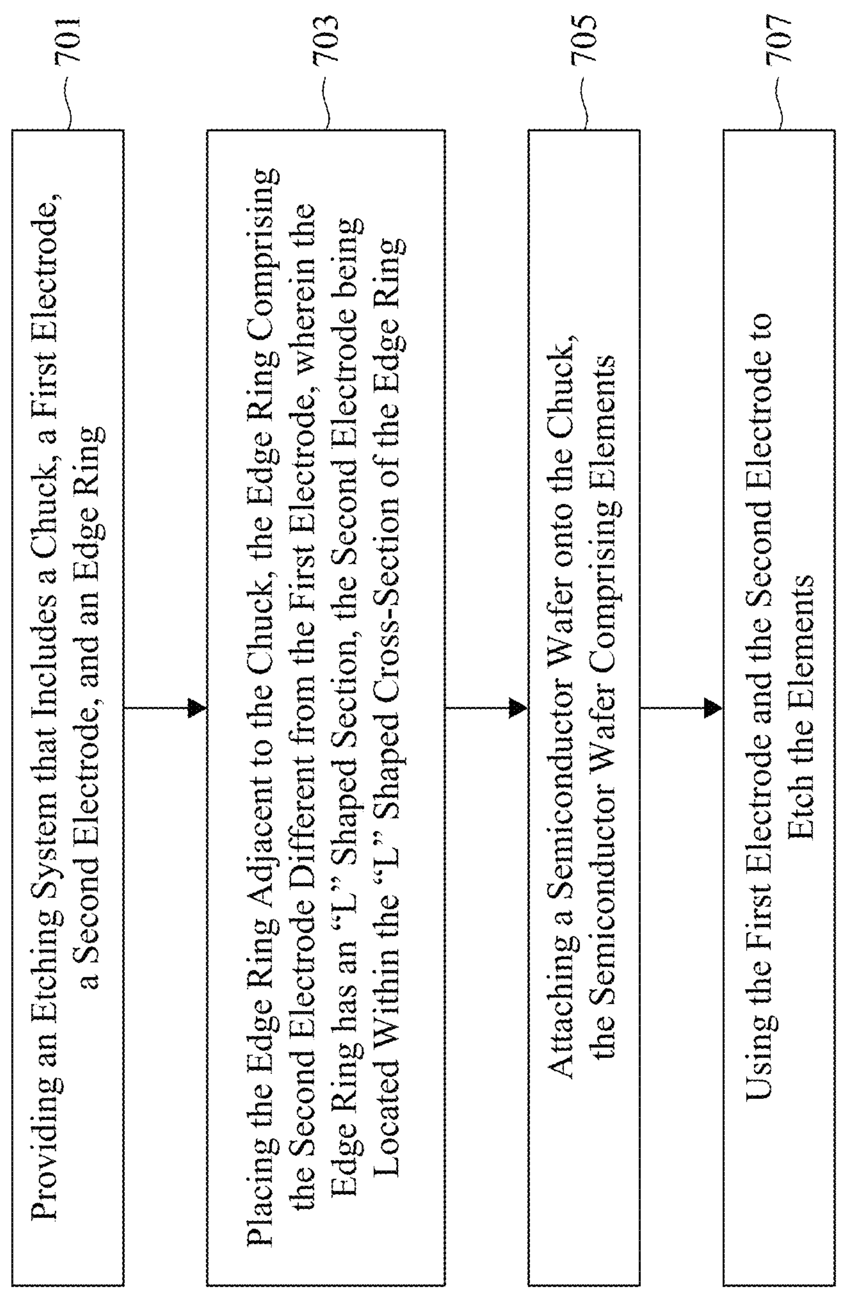
FIG. 7 illustrates a method, in accordance with some embodiments.

FIG. 7 illustrates a method. In an embodiment the method comprises a first step 701, a second step 703, a third step 705, and a fourth step 707. The first step 701 comprises providing an etching system that includes a chuck, a first electrode, a second electrode, and an edge ring. The second step 703 comprises placing the edge ring adjacent to the chuck, the edge ring comprising the second electrode different from the first electrode, wherein the edge ring has an "L" shaped cross section, the second electrode being located within the "L" shaped cross-section of the edge ring. The third step 705 comprises attaching a semiconductor wafer onto the chuck, the semiconductor wafer comprising elements. The fourth step 707 comprises using the first electrode and the second electrode to etch the elements.

By using the tools and processes described herein, a more uniform etching profile along the wafer edge may be achieved by tailoring the electric field through the electric conductivity of a tunable doping edge ring. The electric field can be controlled and adjusted by utilizing different voltages and different materials of electric conductivity to fit the desired etching profile. Furthermore, by controlling the electronic field during operation to maintain the plasma sheath in a plane parallel to the semiconductor wafer and the mounting platform, vertical etching may be achieved for the edge region of the semiconductor wafer preventing Etch-Induced Overlay Shift (EIOS) and minimizing yield loss (e.g., 7%) from leakage induced short circuits in the edge region. Furthermore, by controlling the electric field over time and based on the wear of the edge ring due to repeated use, the effective life of the edge ring may be extended (e.g., beyond 800 hours). As such, such a tuning helps to overcome the inability of other process factors, such as transformer-coupled capacitive tuning (TCCT) parameter, the electrostatic chuck multi-zone temperature parameters, and gas position parameters (e.g., center, edge, equal) to achieve a more uniform process to achieve the desired critical dimensions and profiles while also extending the useful life of the edge ring. Additionally, the above described process will help to reduce or eliminate problems related to uniformity mismatch either within the wafer or else between chambers and help to reduce time and costs associated with replacing the edge ring.

According to an embodiment, a method of manufacturing a semiconductor device includes: providing a chuck, the chuck including a first electrode; and placing an edge ring adjacent to the chuck, the edge ring including a second electrode. In an embodiment, the method further includes applying a DC voltage to the second electrode. In an embodiment of the method, the edge ring includes a coil and wherein applying the DC voltage to the second electrode includes inducing an electric current within the coil. In an embodiment of the method, the DC voltage is based at least in part on a thickness of the edge ring. In an embodiment of the method, a magnitude of the DC voltage is based at least in part on a time in service of the edge ring. In an embodiment of the method, a magnitude of the DC voltage is based at least in part on a shape of the edge ring. In an embodiment of the method, the edge ring is electrically isolated from the chuck.

According to another embodiment, a method of manufacturing a semiconductor device includes: placing an edge ring adjacent to an electrostatic chuck; attaching a first semiconductor wafer onto the electrostatic chuck; generating a plasma sheath over the first semiconductor wafer; and applying a first voltage bias to the edge ring. In an embodiment of the method, the first voltage bias is a DC voltage bias. In an embodiment of the method, the edge ring includes a coil. In an embodiment of the method, a magnitude of the DC voltage bias is based at least in part on a distance an upper surface of the edge ring is from the plasma sheath. In an embodiment, the method, a magnitude of the DC voltage bias is based at least in part on a time in service of the edge ring. In an embodiment, the method further includes applying a second voltage bias to the electrostatic chuck. In an embodiment, the method further includes attaching a second semiconductor wafer onto the electrostatic chuck after the attaching the first semiconductor wafer; and applying a second voltage bias to the edge ring, the second voltage bias different from the first voltage bias.

According to still another embodiment, a semiconductor manufacturing tool includes: an electrostatic chuck; a first electrode electrically coupled to the electrostatic chuck; and an edge ring extending over the electrostatic chuck, wherein the edge ring includes a coil embedded in a dielectric material. In an embodiment, the tool further includes a voltage generator electrically connected to the coil. In an embodiment of the tool, the voltage generator is a DC voltage generator. In an embodiment, the tool further includes an RF generator electrically connected to the first electrode. In an embodiment of the tool, a portion of the first electrode is located within an edge portion of the electrostatic chuck and the coil is located over the portion of the first electrode. In an embodiment of the tool the dielectric material of the edge ring includes a high electron mobility material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

providing an etching system that includes a chuck, a first electrode, a second electrode, and an edge ring;

placing the edge ring adjacent to the chuck, the edge ring comprising the second electrode different from the first electrode, wherein the edge ring has an "L" shaped cross-section, the second electrode being located within the "L" shaped cross-section of the edge ring;

attaching a semiconductor wafer onto the chuck, the semiconductor wafer comprising elements; and using the first electrode and the second electrode to etch the elements.

2. The method of claim 1, further comprising applying a direct current (DC) voltage to the second electrode.

3. The method of claim 2, wherein the edge ring comprises a coil and wherein applying the DC voltage to the second electrode comprises inducing an electric current within the coil.

4. The method of claim 2, wherein the DC voltage is based at least in part on a thickness of the edge ring.

5. The method of claim 2, wherein a magnitude of the DC voltage is based at least in part on a time in service of the edge ring.

6. The method of claim 2, wherein a magnitude of the DC voltage is based at least in part on a shape of the edge ring.

7. The method of claim 1, wherein the chuck is an electrostatic chuck, wherein the edge ring is electrically isolated from the chuck, and wherein the method further comprises:

generating a plasma sheath over a first semiconductor wafer; and applying a first voltage bias to the second electrode of the edge ring.

8. A method comprising:

providing an etching system including a chuck, a first electrode, a second electrode, and an edge ring;

placing the edge ring adjacent to the chuck, the edge ring comprising silicon nitride and the second electrode different from the first electrode, wherein the edge ring has an "L" shaped cross-section, wherein at least a portion of the second electrode extends into the "L" shaped cross-section of the edge ring;

attaching a semiconductor wafer onto the chuck, the semiconductor wafer comprising elements; and using the first electrode and the second electrode to perform an etch on the elements.

9. The method of claim 8, further comprising applying a direct current (DC) voltage to the second electrode.

10. The method of claim 9, wherein the edge ring comprises a coil and wherein applying the DC voltage to the second electrode comprises inducing an electric current within the coil.

11. The method of claim 9, wherein the DC voltage is based at least in part on a thickness of the edge ring.

12. The method of claim 9, wherein a magnitude of the DC voltage is based at least in part on a time in service of the edge ring.

13. The method of claim 9, wherein a magnitude of the DC voltage is based at least in part on a shape of the edge ring.

14. The method of claim 8, wherein the chuck is an electrostatic chuck, wherein the edge ring is electrically isolated from the chuck, and wherein the method further comprises:

generating a plasma sheath over a first semiconductor wafer; and applying a first voltage bias to the second electrode of the edge ring.

15. A method comprising:

providing an etching system including a chuck, a first electrode, a second electrode, and an edge ring;

placing the edge ring adjacent to the chuck, the edge ring comprising the second electrode different from the first electrode, wherein the edge ring has an "L" shaped cross-section, and wherein the edge ring has a carbon concentration of between about 45%-atomic and about 55%-atomic, the "L" shaped cross-section encircling at least a portion of the second electrode;

attaching a semiconductor wafer onto the chuck, the semiconductor wafer comprising elements; and using the first electrode and the second electrode to perform an etch on the elements.

16. The method of claim 15, further comprising applying a direct current (DC) voltage to the second electrode.

17. The method of claim 16, wherein the edge ring comprises a coil and wherein applying the DC voltage to the second electrode comprises inducing an electric current within the coil.

18. The method of claim 16, wherein the DC voltage is based at least in part on a thickness of the edge ring.

19. The method of claim 15, wherein a magnitude of a DC voltage is based at least in part on a time in service of the edge ring.

20. The method of claim 15, wherein a magnitude of a DC voltage is based at least in part on a shape of the edge ring.

* * * * *